United States Patent
Nam et al.

(10) Patent No.: US 9,385,749 B1
(45) Date of Patent: Jul. 5, 2016

(54) DYNAMIC DATA COMPRESSION SELECTION

(71) Applicant: Oracle International Corporation, Redwood City, CA (US)

(72) Inventors: Young Jin Nam, Cupertino, CA (US); Aaron James Dailey, San Jose, CA (US); John Forte, Redwood City, CA (US)

(73) Assignee: Oracle International Corporation, Redwood City, CA (US)

(*) Notice: Subject to any disclaimer, the term of this patent is extended or adjusted under 35 U.S.C. 154(b) by 0 days.

(21) Appl. No.: 14/641,079

(22) Filed: Mar. 6, 2015

(51) Int. Cl.
*H03M 7/34* (2006.01)
*H03M 7/30* (2006.01)
*H03M 7/28* (2006.01)

(52) U.S. Cl.
CPC .............. *H03M 7/3064* (2013.01); *H03M 7/28* (2013.01)

(58) Field of Classification Search
CPC ............................. H03M 7/3064; H03M 7/28
USPC ...................................................... 341/50, 51
See application file for complete search history.

(56) References Cited

U.S. PATENT DOCUMENTS

| 6,349,150 | B1* | 2/2002 | Jones ...................... H03M 7/30 375/E7.093 |
| 8,554,746 | B2* | 10/2013 | Weinberger ....... G06F 17/30584 380/217 |
| 2009/0012982 | A1* | 1/2009 | Merchia .................. H03M 7/30 |
| 2012/0158672 | A1* | 6/2012 | Oltean .............. G06F 17/30091 707/692 |
| 2013/0060739 | A1* | 3/2013 | Kalach .............. G06F 17/30159 707/692 |
| 2014/0086309 | A1* | 3/2014 | Beer-Gingold ..... H03M 7/3064 375/240.02 |

\* cited by examiner

*Primary Examiner* — Jean B Jeanglaude
(74) *Attorney, Agent, or Firm* — Polsinelli PC

(57) ABSTRACT

Aspects of dynamic data compression selection are presented. In an example method, as uncompressed data chunks of a data stream are compressed, at least one performance factor affecting selection of one of multiple compression algorithms for the uncompressed data chunks of the data stream may be determined. Each of the multiple compression algorithms may facilitate a different expected compression ratio. One of the multiple compression algorithms may be selected separately for each uncompressed data chunk of the data stream based on the at least one performance factor. Each uncompressed data chunk may be compressed using the selected one of the multiple compression algorithms for the uncompressed data chunk.

20 Claims, 14 Drawing Sheets ically results in a reduction in the amount of communication bandwidth consumed when the compressed data is transferred over a communication network or connection. In some examples, data compression may be "lossless," in which the original pre-compression data may be completely reconstructed from the compressed data. In other implementations, the data compression may be "lossy," in which the original data may not be reconstructed completely or perfectly. Lossy data compression is often employed in applications, such as audio compression or image compression, in which perfect reproduction of the original data is unimportant for the expected use of that data. In other examples, such as remote replication of data for disaster recovery and similar backup purposes, applications often employ lossless compression so that all of the compressed data may be reproduced in its original form for subsequent use by the enterprise or other entity relying on the presence of that data.

DYNAMIC DATA COMPRESSION SELECTION

TECHNICAL FIELD

Aspects of the present disclosure relate generally to data compression technology and, more specifically, to dynamic data compression selection.

BACKGROUND

As the term suggests, data compression involves the compressing, or reduction in size, of data. Consequently, data compression typ In the example of remote replication and other data backup-and-restore functions, the data to be saved is often compressed at the data source and subsequently transmitted over a network to a data target that is geographically remote from the source so that the data may be transmitted more quickly over the network (both from the data source to the target and vice-versa). The remote storing of the data is often desirable for disaster recovery, as a single disaster is unlikely to affect the data at both the local and the remote locations. Oftentimes, an operator of the data source manually determines whether a particular set or stream of data to be replicated is to be compressed prior to transmission. The operator may make such a determination based on any number of static factors, such as the amount of data to be replicated and the relative importance of the data.

It is with these observations in mind, among others, that aspects of the present disclosure were conceived.

SUMMARY

Aspects of the present disclosure involve a system for data compression employing dynamic compression selection. The system may include a performance monitor, a compression selection module, and a compression module. The performance monitor may determine, as uncompressed data chunks of a data stream are compressed, at least one performance factor affecting selection of one of multiple compression algorithms for the uncompressed data chunks of the data stream, in which each of the multiple algorithms facilitates a different expected compression ratio. The compression selection module may select separately, for each uncompressed data chunk, one of the algorithms based on the performance factor. The compression module may compress each uncompressed data chunk using the selected algorithm for the uncompressed data chunk. Other potential aspects of the present disclosure are described in greater detail below.

BRIEF DESCRIPTION OF THE DRAWINGS

Exemplary embodiments are illustrated in referenced figures of the drawings. It is intended that the embodiments and figures disclosed herein are to be considered illustrative rather than limiting. The use of the same reference numerals in different drawings indicates similar or identical items.

DETAILED DESCRIPTION

In at least some embodiments described below, a system for dynamic data compression selection may select one of multiple data compression algorithms for each uncompressed data chunk of a data stream based on at least one performance factor, and then compress each data chunk using the selected data compression algorithm for that data chunk. Dynamically selecting the type of data compression for each chunk of the data stream thus may allow the system to adapt to changing conditions in the operational environment of a source of the data stream, and may relieve an operator of the source from the administrative task of manually enabling and disabling data compression, which is unlikely to allow the operator to react quickly to the changing conditions. These and other potential advantages will be recognized from the discussion set out herein.

Figure 1:
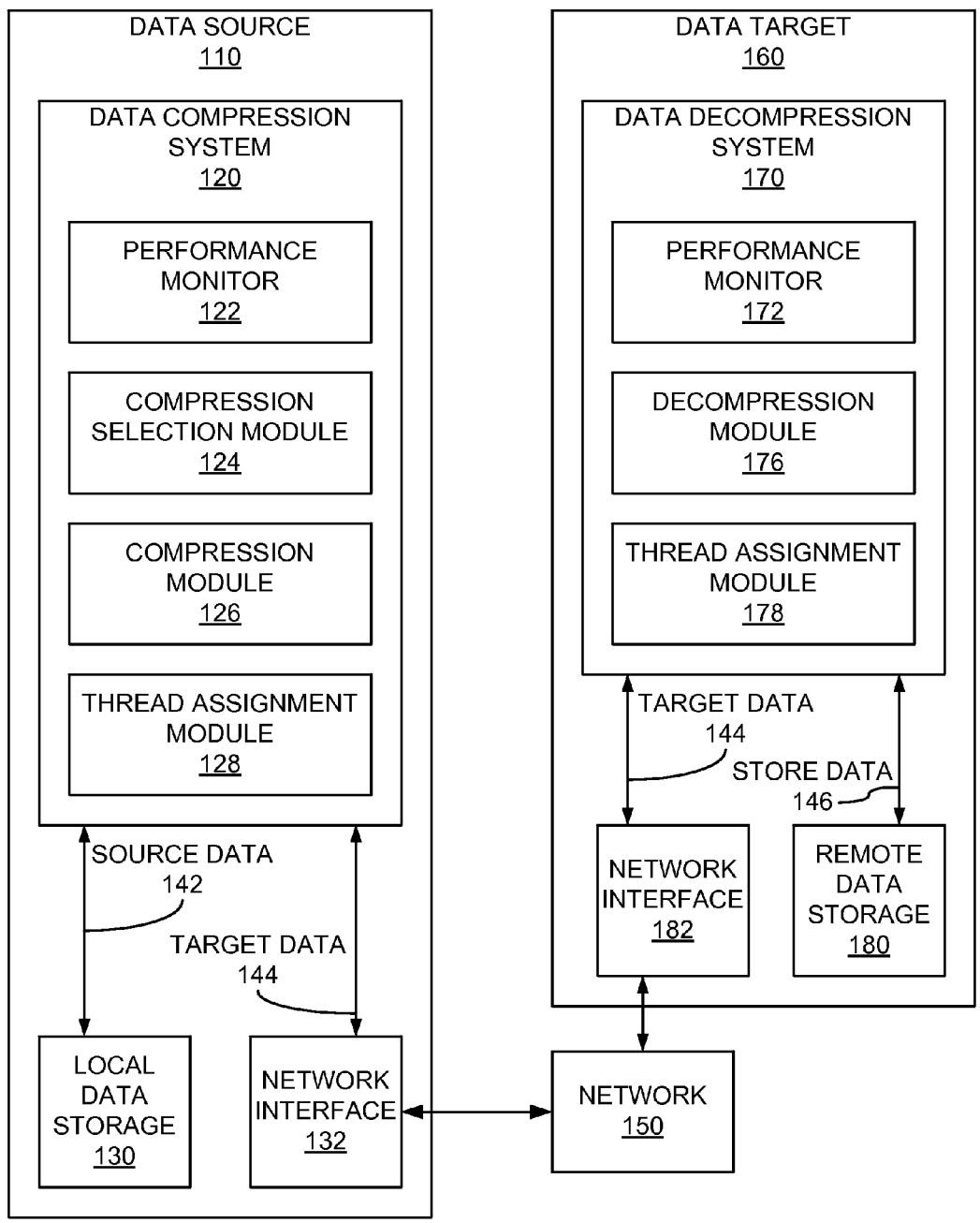
FIG. 1 is a block diagram of an example data source and data target, in which the data source includes a data compression system employing dynamic data compression algorithm selection.

FIG. 1 is a block diagram of an example data source 110 including a data compression system 120 employing dynamic data compression algorithm selection, along with a corresponding data target 160. The data compression system 120 may be configured to retrieve or receive source data 142 from local data storage 130, compress the source data 142 to yield compressed target data 144, and transmit the target data 144 via a network interface 132 over a network 150 or communication connection to remote data storage 180 of the data target 160. In at least some examples, the data compression system 120 may monitor at least one performance factor, such as one or more factors involving the data source 110, the network 150, or the data target 160, and select a particular data compression algorithm, or particular parameters for a data compression algorithm, for each individual portion of the source data 142. Each of the available compression algorithms may provide or facilitate a different expected compression ratio for the resulting compressed data.

The source data 142 may be, for example, any data that a user, owner, or operator causes to be compressed and subsequently transferred for storage at some other, possibly remote, location. Examples of the source data 142 may include, but are not limited to, financial data, employee data, sales and marketing data, product data, engineering data, technical specifications, image data, audio/video data, and the like. Also, as is described in greater detail below, the source data 142 may be retrieved by, or provided to, the data compression system 120 as one or more individual data streams, each of which be segmented into multiple data "chunks" for compression. Further, the data compression system 120 may process the data streams, as well as the individual chunks of one or more data streams, concurrently or simultaneously by way of multiple software processes and/or execution threads operating within the data source 110. In an example, each data stream may include one or more data files, data file folders, or some other data container or structure.

In one example, the data source 110 may be a client or customer computer system that includes or accesses the source data 142 stored at the local data storage 130. The local data storage 130 may include hard disk drive storage, flash-based data storage, optical drive storage, or any other type of data storage media. While the particular example of FIG. 1 depicts the local data storage 130 as residing within the data source 100, the local data storage 130 may be located external to the data source 110 in some examples, with the data source 110 accessing the local data storage 130 by way of a communication connection or network, such as, for example, a wide area network (WAN) (e.g., the Internet) or a local area network (LAN) (e.g., an Ethernet or Wi-Fi® connection), or any other connection usable for communicatively coupling a computer to data storage.

The data target 160 may be, in an example, any computer or computing system configured to receive the target data 144 via the network 150 or similar communication connection. In some examples, the data target 160 may be any kind of data server or data storage system, such as a file server, file system, logical volume manager, and so on. In a particular embodiment, the data target may be a ZFS® combined file system/logical volume manager provided by Oracle Corporation of Redwood City, Calif. Also, as with the local data storage 130, the remote data storage 180 may include hard disk drive storage, flash-based data storage, optical drive storage, or any other type of data storage media, and may be either incorporated within the data target 160, or accessible by the data target 160 via a network or other communication network.

The network 150 may be any communication network or connection (e.g., a WAN, LAN, cellular data network, or the like) over which the target data 144 may be transferred between the data source 110 and the data target 160. Accordingly, the network interface 132 of the data source 110 may be any interface that communicatively couples the data source 110 to the communication connection or network 150 so that the target data 144 may be transmitted to the data target 160 via the network 150.

As illustrated in FIG. 1, the data compression system 120 of the data source 110 may include a performance monitor 122, a compression selection module 124, a compression module 126, and/or a thread assignment module 128. The data compression system 120 may include other modules or components not explicitly depicted in FIG. 1, but such modules or components are not discussed further herein to simplify and focus the following discussion. Similarly, the data source 110 may include other components or modules, such as, for example, a user interface, a power supply, and so on, but such components are not described further herein for simplicity. Additionally, the data target 160 may also include corresponding versions of at least some of the modules or components of the data source 110, such as, for example, a performance monitor 172, a decompression module 176, and a thread assignment module 178 of a data decompression system 170, as well as a network interface 182. Such modules would facilitate reception of the target data 144 from the network 150 via the network interface 182, and decompression of the target data 144 by the data decompression system 170 before storage of the data as decompressed store data 146 at the remote data storage 180. In yet other examples, some systems may be employed as both a data source 110 and a data target 160, thus possibly incorporating the modules corresponding to both the data source 110 and the data target 160, as described herein.

Each of the performance monitor 122, the compression selection module 124, the compression module 126, and the thread assignment module 128 in the data compression system 120 of the data source 110 may be implemented in an example by way of one or more processors executing a software application, process, thread, service, or other mechanism to perform the various tasks or operations ascribed to each of the modules 122-128 discussed herein. In other examples, one or more of the modules 122-128 may be hardware components or circuits (e.g., application-specific integrated circuits (ASICs) or field-programmable gate arrays (FPGAs)), or some combination of hardware, firmware, and/or software components. The modules 172, 176, and 178 in the data decompression system 170 of the data target 160 may be similarly implemented, and operate in a corresponding fashion to, the corresponding modules 122, 126, and 128 in the data compression system 120 of the data source 110.

The performance monitor 122 of the data compression system 120 may be configured to determine at least one performance factor affecting selection of one of multiple compression algorithms for compressing uncompressed data chunks of a data stream. In one example, the performance monitor 122 may determine the at least one performance factor periodically or repeatedly so that a new selection of the particular compression algorithm to be used may be performed on a per-chunk basis, or once every multiple number of chunks. In one example, the size of a data chunk may be on the order of one megabyte (1 MB), but smaller or larger sizes for the data chunk may be utilized in other embodiments. Examples of the at least one performance factor to be monitored may include, but are not limited to, a compression ratio of at least one previously compressed data chunk of the data stream, a current network throughput associated with the data stream, and a current processor utilization of the data source 110.

The compression selection module 124 may be configured to select one of the multiple compression algorithms for the uncompressed data chunks of the data stream based on the at least one performance factor. In one example, the compression selection module 124 may make a separate compression algorithm selection for each uncompressed data chunk to be compressed. Consequently, the compression algorithms to be employed in compressing the data stream may be changed as often as once per chunk of the data stream to react to changing conditions at the data source 110, the network 150, and/or the data target 160. In other examples, the compression selection module 124 may select a particular algorithm for each set of multiple chunks (e.g., each set of two chunks, each set of three chunks, and so on) of the data stream.

The compression module 126 may be configured to perform the compression on the data chunks using the compression algorithms selected by the compression selection module 124. In examples in which the compression selection module 124 selects one of the compression algorithms for each data chunk of the data stream, the compression module 126 may compress each data chunk using the selected algorithm for the corresponding data chunk. In other embodiments, the compression module 126 may apply a particular algorithm to each set of chunks for which the compression selection module 124 has selected that algorithm. Depending on the particular embodiment, the compression selection module 124 or the compression module 126 may generate an indication of the particular selected compression algorithm for compressing each data chunk to accompany its associated data chunk so that the decompression module 176 in the data decompression system 170 of the data target 160 may use the appropriate decompression algorithm to decompress the data chunk prior to storage in the remote data storage 180.

The thread assignment module 128, in some embodiments, may be configured to assign and/or apportion available execution threads in the data source 110, such as from a shared thread pool, to one or more data streams to compress the data chunks using the compression module 126. In at least some examples, the thread assignment module 128 may perform the thread assignment based on the fullness or emptiness of network queues of the network interface 132. This functionality of the thread assignment module 128 is discussed in greater detail below in conjunction with FIGS. 6-9. Further, the thread assignment module 178 in the data decompression system 170 of the data target 160 may employ one or more execution threads from a shared thread pool to decompress the received data chunks using the decompression module 176 in a similar manner.

Figure 2:
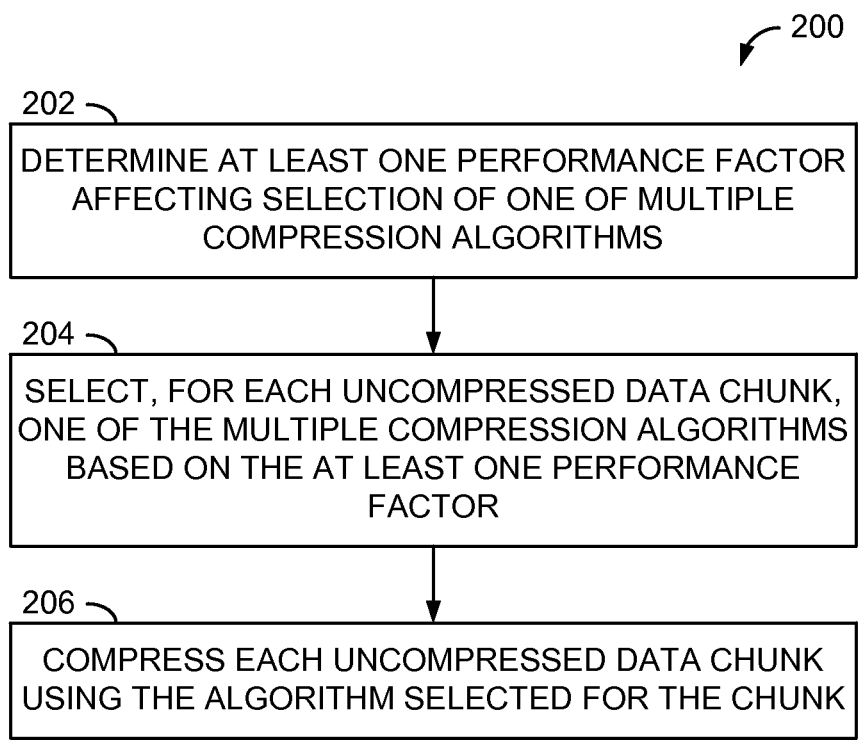
FIG. 2 is a flow diagram of an example method of dynamic data compression algorithm selection.

FIG. 2 is a flow diagram of an example method 200 of dynamic data compression algorithm selection. In the following description, the method 200 is presumed to be performed by the data source 110 and the data compression system 120 of FIG. 1. However, other systems or devices not specifically described herein may perform the method 200 in other embodiments.

In the method 200, at least one performance factor affecting selection of one of a plurality of compression algorithms is determined (operation 202). The one or more performance factors may include, but are not limited to, a compression ratio of one or more previously compressed data chunks of the data stream, a current network throughput corresponding to the data stream, and a current processor utilization of the data source 110. For example, the compression ratio of a most recently compressed data chunk may be determined by comparing the pre-compression length or size of the chunk (e.g., in bytes) against the post-compression length of that chunk to determine the overall compression ratio associated with the compressed chunk.

In other examples, the performance monitor 122 may determine or measure one or more of the performance factors indirectly, as opposed to measuring directly the particular factor or metric. For example, a depth, fullness, or emptiness of a buffer or queue within the data source 110, or an amount, number, or percentage of a particular resource that is available or unavailable within the data source 110, may serve as a proxy or indirect indication of a particular performance factor, as is discussed in greater detail below in connection with FIGS. 4 and 5.

In some embodiments, the performance monitor 122 may determine one or more of the performance factors relative to the data chunks to be compressed, such once per data chunk of a data stream, once per set of multiple data chunks of a data stream, or over some other interval of data chunks. In other examples, the performance monitor 122 may determine one or more of the performance factors periodically, such as once every few hundred microseconds, once every millisecond or multiple milliseconds, and so on. Also, in scenarios in which multiple data streams are to be compressed concurrently or simultaneously, the performance monitor 122 may monitor one or more of the performance factors relative to the particular data stream being processed, and may monitor one or more other factors across the data source 110 as a whole. For example, the performance monitor 122 may measure a separate data chunk compression ratio and a network throughput separately for each data stream, but may employ a single measurement of the processor utilization for all of the data streams.

Further in the method 200, one of the multiple compression algorithms may be selected for each data chunk, or set of data chunks, of a data stream based on the at least one performance factor (operation 204). In some examples, the multiple compression algorithms may be completely different algorithms performing compression using vastly different methods. In other embodiments, two or more of the compression algorithms may be the same basic compression algorithm being configured with different parameters or values upon which one or more portions of the algorithm are based.

In some embodiments, the compression selection module 124 may compare one or more of the performance factors to corresponding thresholds or levels to determine which of the compression algorithms to select. Further, whether a particular performance factor has exceeded a particular threshold may represent a logic state of a variable in a Boolean equation, within which other logic states corresponding to other performance factors may be related, such as by way of AND or OR operators, to determine whether a particular compression is selected. In examples in which two compression algorithms are available, such a Boolean equation may indicate which algorithm is to be employed for the current data chunk based on whether the equation evaluates to TRUE or FALSE in light of the current performance factors. In embodiments in which more than two compression algorithms are available, multiple thresholds may be employed for one or more of the performance factors, resulting in a multi-bit state for each performance factor, with each state being employed in more than one Boolean equation to produce a multi-bit output indicating which of the multiple compression algorithms to be employed for the current data chunk. In yet other examples, the values of the various performance factors may be employed in a mathematical equation that produces a numeric value that may then be compared to one or more thresholds in order to determine which of two or more compression algorithms may be utilized to compress the current data chunk.

The compression selection module 124, in some embodiments, may utilize other information in addition to the performance factors in making the algorithm selection. For example, in order to interpret the compression ratio of a previously compressed data chunk, the compression selection module 124 may take into account the particular compression algorithm that was employed to compress that chunk. The compression selection module 124 or the compression module 126 may store that information with the chunk or at another memory location. In one implementation, the compression selection module 124 may select a particular threshold from a plurality of such thresholds based on the particular compression algorithm that was employed to compress the chunk to compare against the compression ratio for that chunk because the amount of compression attained may be affected to at least some degree by the particular compression algorithm that was utilized.

Once a particular compression algorithm has been selected for a data chunk or set of data chunks, the one or more chunks may be compressed using the selected algorithm (operation 206) prior to transfer of the compressed chunk to the data target 160, as described earlier.

While the operations 202-206 are depicted as operations performed in a particular sequence, the operations 202-206 of FIG. 2, as well as other method operations described herein, may be performed in other orders of execution, including in a parallel, overlapping, or concurrent manner. For example, the operations 202-206 of FIG. 2 may be performed as part of a pipelined operation structure in which the operations 202-206 are performed repeatedly or continually for each data chunk of a data stream to be compressed. In addition, each of the operations 202-206 may be performed for each of multiple data streams that are to be compressed concurrently or simultaneously.

Figure 3:
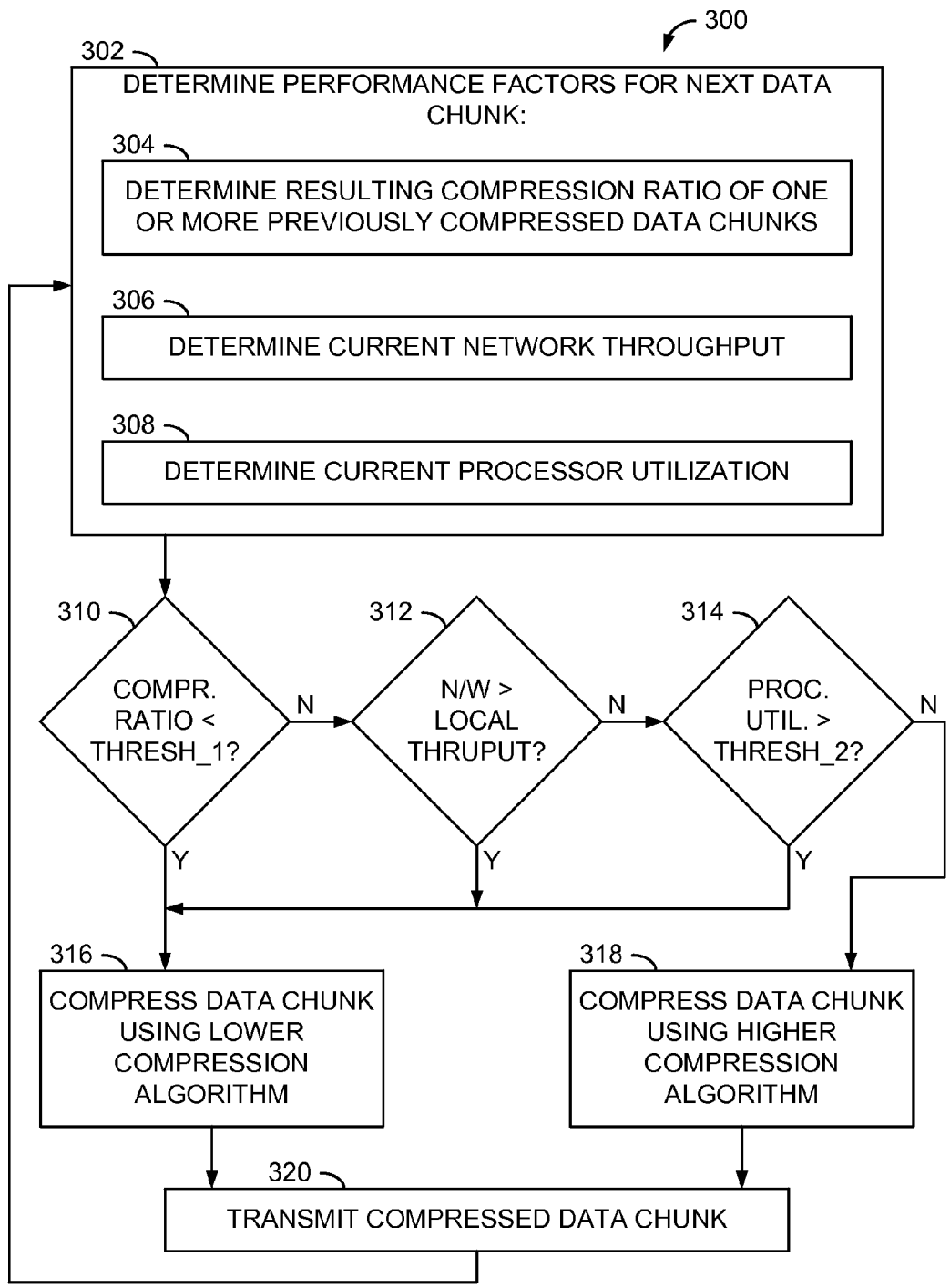
FIG. 3 is a flow diagram of another example method of dynamic data compression algorithm selection.

FIG. 3 is a flow diagram of another example method 300 of dynamic data compression algorithm selection. In this particular example, two compression algorithms are available: a "best compression" algorithm that may provide a relatively high compression ratio, and a "best speed" algorithm that may provide a relatively low compression ratio compared to the best compression algorithm, but may perform its compression significantly faster than the best compression algorithm for the same chunk of data. In a particular example, the best compression algorithm may be the GZIP-1 lossless data compression algorithm associated with the GNU Project, and the best speed algorithm may be the LZJB (Lempel Ziv Jeff Bonwick) lossless data compression algorithm often identified with the ZFS® file system. However, other compression algorithms, including possibly lossy algorithms in some applications, may be employed in other embodiments.

In the method 300, several performance factors may be determined for each uncompressed data chunk (operation 302). More specifically, a resulting compression ratio of one or more previously compressed data chunks may be determined (operation 304). In this example, the performance monitor 122 may determine the compression ratio of the data chunk that immediately precedes the current data chunk in the data stream. In other examples, the performance monitor 122 may determine the compression ratio of the next previous data chunk, or an average of compression ratios of the most recent compressed data chunks for which such information is available. Also in this particular embodiment, each data chunk is 1 MB in size, and the compression ratio of the previous or most recent 1024 data chunks, or previous 1 GB (gigabyte) of data chunks, may be considered to determine the compression ratio to be employed for the current data chunk in the data stream. However, other data chunk sizes and numbers of data chunks may be employed in other examples.

The current network throughput associated with the current data stream over the network 150 may also be determined (operation 306). In one example, the performance monitor 122 may determine or monitor the network throughput once per uncompressed data chunk at the network interface 132 relative to the throughput of the local data storage 130 of the data source 110. In this particular embodiment, the performance monitor 122 may determine the current network throughput based on the emptiness or fullness of a network queue associated with the network interface 132, as is described in greater detail below in conjunction with FIG. 4.

Continuing with the example of FIG. 3, the current processor utilization of the data source 110 may also be determined or monitored (operation 308) once per data chunk. However, unlike the compression ratio and the current network throughput, where are measured periodically or repeatedly for each data chunk of each stream, the current processor utilization may be determined periodically or once per chunk across all data streams, as the one or more processors being utilized are a system resource utilized by the data compression system 120 to compress each of the data streams. As is discussed below in connection with FIG. 5, the performance monitor 122 may determine the processor utilization by determining how many execution threads of a thread "pool" are currently active (e.g., being used). In other examples, the performance monitor 122 may determine processor utilization by a number of processes that are currently being employed.

Based on these determined performance factors, one of the two available compression algorithms may then be selected (operations 310-318). More specifically, each of the three performance factors may be compared against a corresponding threshold or value. For example, the compression selection module 124 may determine whether the determined compression ratio of the most recently compressed chunk of the data stream is less than a particular threshold (e.g., THRESH_1) (operation 310). If so, the compression selection module 124 may select the lower compression algorithm (e.g., the best speed algorithm) to compress the current, uncompressed data chunk (operation 316) using the compression module 126. Otherwise, the compression selection module 124 may determine whether the current network throughput associated with the data stream exceeds the current throughput of the local data storage 130 (operation 312). If so, the compression selection module 124 again may select the lower compression algorithm (e.g., the best speed algorithm) to compress the current, uncompressed data chunk (operation 316) using the compression module 126. Otherwise, the compression selection module 124 may determine whether the current processor utilization within the data source 110 exceeds a corresponding threshold (e.g., THRESH_2) (operation 314). If so, the compression selection module 124 again may select the lower compression algorithm (e.g., the best speed algorithm) to compress the current, uncompressed data chunk (operation 316) using the compression module 126. Otherwise, the compression selection module 124 may select the higher compression algorithm (e.g., the best compression algorithm) to compress the current, uncompressed data chunk (operation 318) using the compression module 126. Consequently, in this specific example, the best speed compression is employed in response to any one or more of the performance factors having crossed its corresponding threshold (in the positive or negative direction, depending on the factor), thus effectively ORing the three conditions together.

Once the current data chunk is compressed, the data chunk is transmitted over the network 150 via the network interface 132 to the data target 160 for storing at the remote data storage 180 (operation 320). This process may then be repeated for each data chunk of the stream, as well as for data chunks of other data streams being compressed concurrently.

Figure 4A:
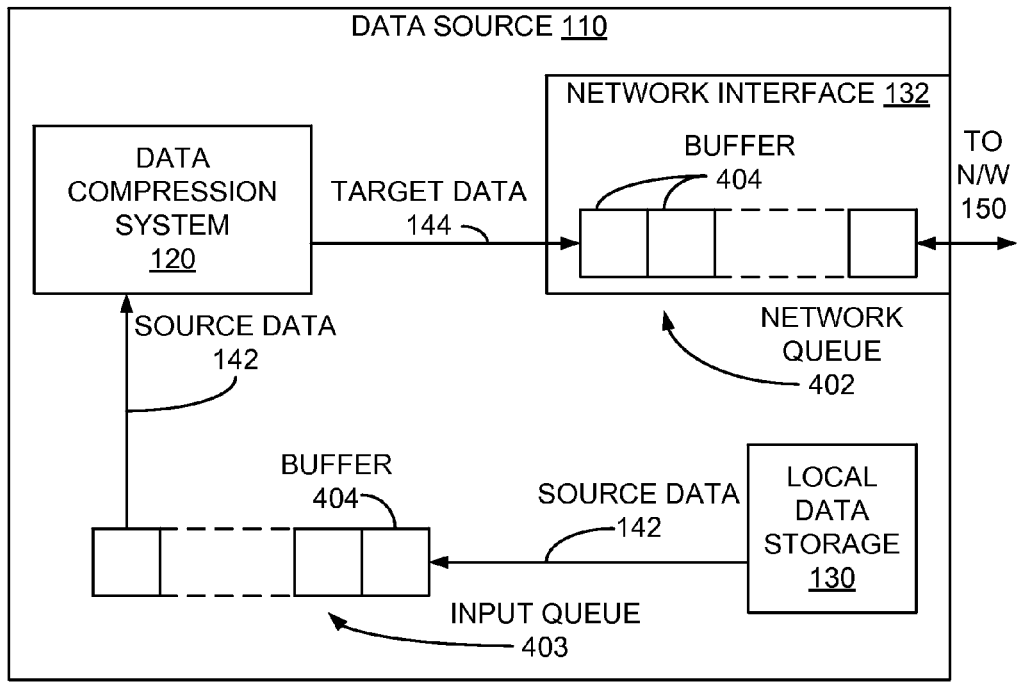
FIG. 4A is a block diagram of an example network queue employed in a data source to determine a performance factor for an example method of dynamic data compression algorithm selection.

FIG. 4A is a block diagram of an example network queue 402 that may be employed in the data source 110 to determine a performance factor for an example method of dynamic data compression algorithm selection, such as the method 300 of FIG. 3. As illustrated in FIG. 4A, the network interface 132 may include the network queue 402; in other embodiments, the network queue 402 may reside outside the network interface 132, such as, for example, between the data compression system 120 and the network interface 132. Further, the network queue 402 may include a number of queue elements or buffers 404, each of which may hold a compressed data chunk of a data stream to be transmitted over the network 150. In embodiments in which more than one data stream may be compressed concurrently or in parallel, a separate network queue 402 may be available for each of the data streams so that each network queue 402 contains data chunks for its corresponding data stream. As shown in FIG. 4, the network queue 402 may be structured as a "first in, first out" (FIFO) buffer, in which compressed data chunks from the data compression system 120 are placed as queue elements or buffers 404 into the network queue 402, and the first of the queue elements 404 is then transmitted first via the network 150 to the data target 160. In other examples, the network queue 402 may be a circular buffer or some other queue-like component.

To determine the network throughput as a performance factor for selecting between two or more compression algorithms, the performance monitor 122 of FIG. 1 may monitor the fullness or emptiness of the network queue 402 as an indication or proxy of the network throughput relative to the throughput of the local data storage 130. For example, the performance monitor 122 may determine the current number or percentage of the queue elements 404 of the network queue 402 that contain a compressed data chunk to be transmitted over the network 150. The compression selection module 124 may then compare that number or percentage to some threshold and, if less than the threshold (e.g., the "depth" of the queue is below the threshold), the compression selection module 124 may determine that the network throughput is greater than the data throughput of the local data storage 130 and the data compression system 120, thus warranting use of the best speed compression algorithm. In other words, if the network queue 402 is sufficiently empty (e.g., the current queue depth is low), the transmission throughput over the network 150 is high compared to the time taken to retrieve the uncompressed data chunks from the local data storage 130 and compress the retrieved chunks. As a result, the compression selection module 124 may thus determine that employing the best speed algorithm would expedite the overall compression and transmission of the data chunks, as the network 150 may be fast enough to transmit compressed data chunks that are not maximally compressed without creating a transmission bottleneck.

As shown in FIG. 4A, the data source 110 may also include an input queue 403 including a number of queue elements or buffers 404, with each of the buffers 404 including an uncompressed data chunk read from the local data storage 130 awaiting compression by the data compression system 120. In one example, as is described in greater detail below in conjunction with FIGS. 4C and 4D, the buffers 404 for both the input queue 403 and the network queue 402 may be allocated from a single general buffer pool within the data source 110, or from a buffer pool associated with the particular data stream being compressed.

Figure 4B:
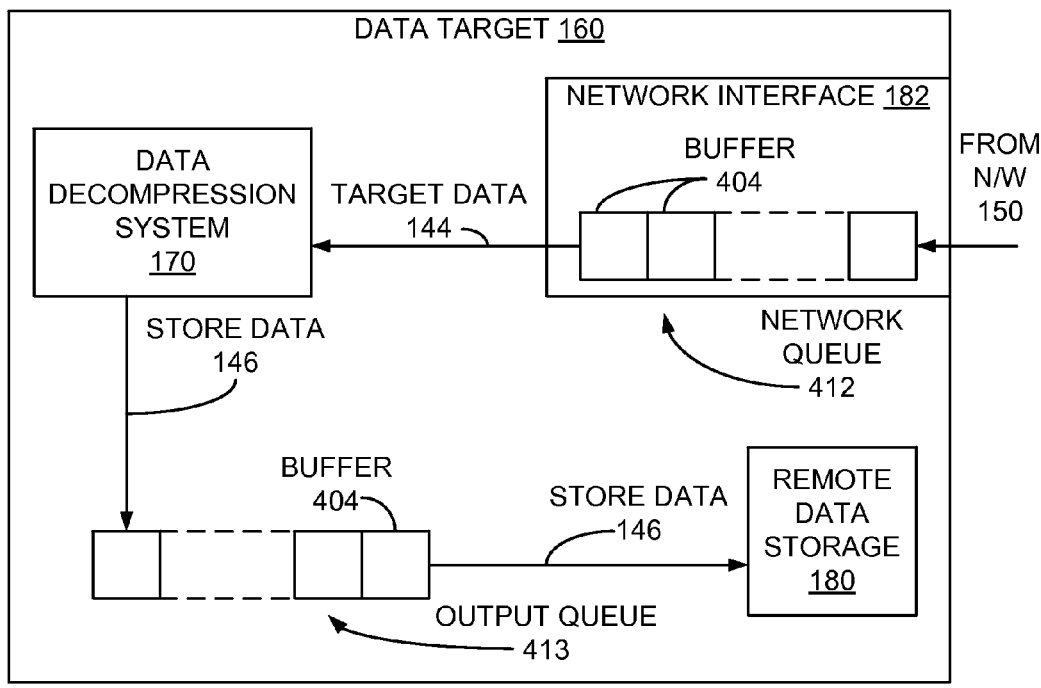
FIG. 4B is a block diagram of an example network queue employed in a data target.

FIG. 4B is a block diagram of an example network queue 412 and associated output queue 413 for data processed by the data decompression system 170 of the data target 160. The network queue 412 may configured to receive each compressed data chunk of a data stream from the data source 110 via the network 150 into a data buffer 404. The network interface 182 may include the network queue 412; in other embodiments, the network queue 412 may reside outside the network interface 182, such as, for example, between the data decompression system 170 and the network interface 182. The network queue 412 may include a number of queue elements or buffers 404, each of which may hold a compressed data chunk of a data stream to be decompressed by the data decompression system 170. In embodiments in which more than one data stream may be compressed concurrently or in parallel, a separate network queue 412 may be available for each of the data streams so that each network queue 412 contains data chunks for its corresponding data stream. As with the network interface 132 of FIG. 4A, the network interface 182 may be structured as a FIFO queue, circular buffer, or some other buffer or queue arrangement.

As depicted in FIG. 4B, the data target 160 may also include an output queue 413 including a number of queue elements or buffers 404, in which each buffer 404 includes an uncompressed data chunk generated by the data decompression system 170 awaiting storage at the remote data storage 180. In one embodiment, as is discussed more fully below in conjunction with FIGS. 4E and 4F, the buffers 404 of both the network queue 412 and the output queue 413 may be allocated from a single general buffer pool provided in the data target 160, or from a buffer pool associated with the particular data stream being decompressed.

Figure 4C:
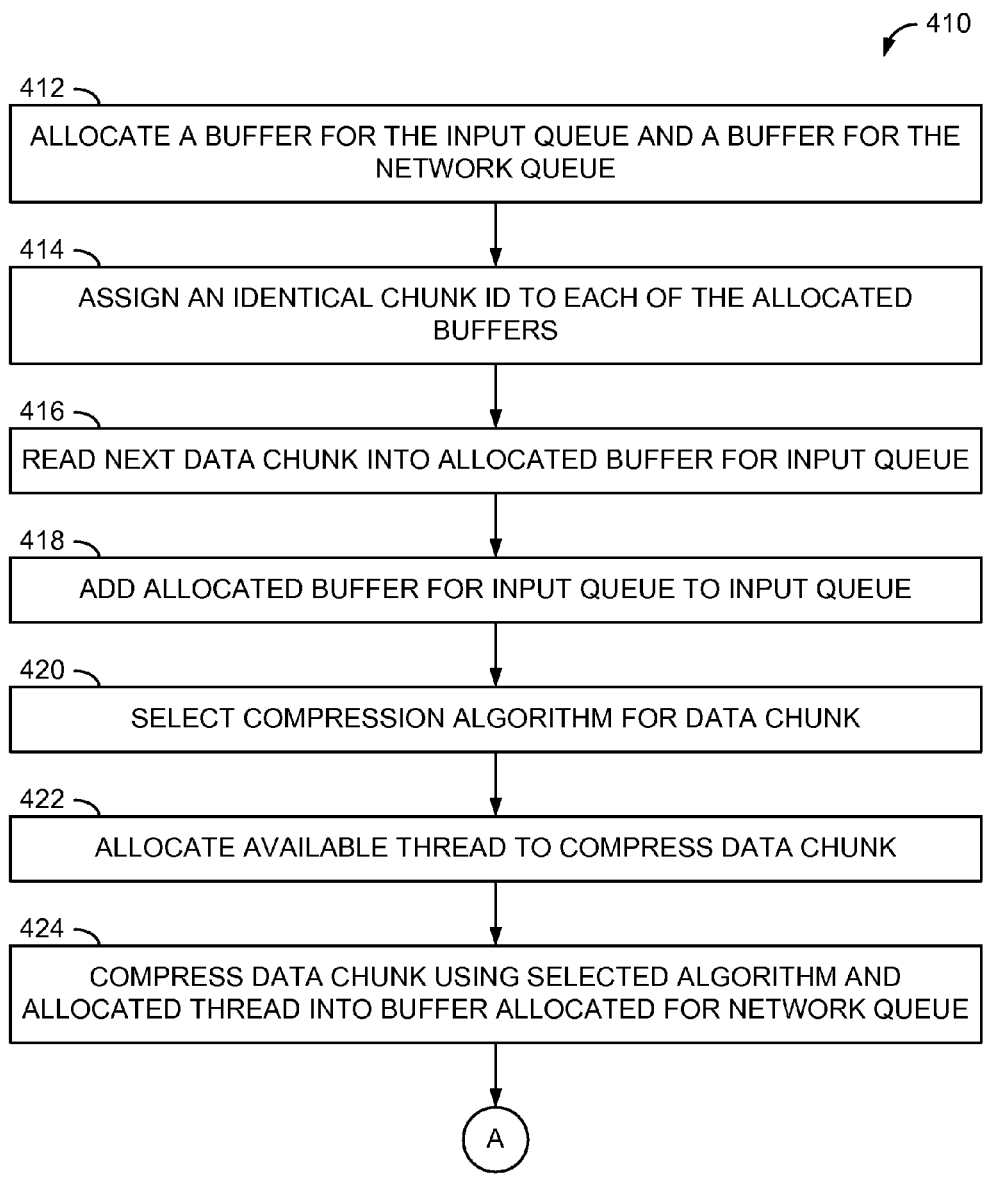
FIGS. 4C and 4D are a flow diagram of an example method of operating the data source of FIGS. 1 and 4A.
Figure 4D:
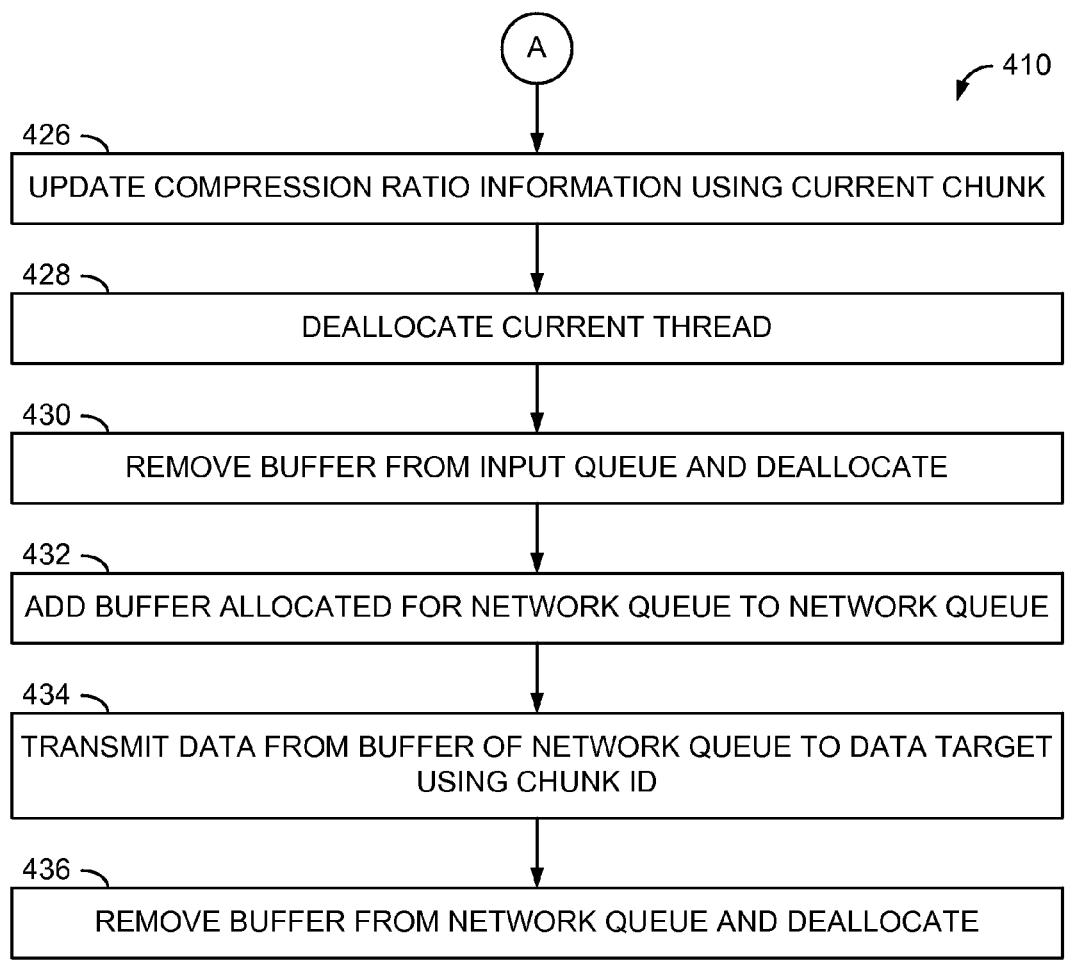

FIGS. 4C and 4D are a flow diagram of an example method 410 of operating the data source 110 of FIGS. 1 and 4A. In the method 400, a buffer 404 may be allocated for each of the input queue 403 and the network queue 402 (operation 412). In some examples, these two buffers 404 may be allocated at the same time. Also, the buffers 404 may be allocated from a buffer pool specifically associated with the current data stream, or from a single buffer pool available for all data streams. In this example, if at least two buffers 404 are not available for allocation, the data source 110 will pause the reading of data chunks from the local data storage 130 until such unallocated buffers 404 are available. Also, an identical identifier may be assigned to each of the two allocated buffers 404 (operation 414) so that each uncompressed data chunk of the input queue 403 may be associated with its corresponding compressed data chunk in the network queue 402, and that the proper order of the compressed data chunks will be maintained when transmitted from the network queue 402 over the network 150 via the network interface 132 to the data target 160. In at least some examples, the identifier associated with each buffer 404 is incremented for each pair of buffers 404 allocated.

The next uncompressed data chunk may then be read into the buffer 404 allocated for the input queue 403 from the local data storage 130 (operation 416). That buffer 404 may then be added to the input queue 403 (operation 418) for processing by the compression module 126. The compression selection module 124 may select a particular compression algorithm (operation 420) (e.g., a best compression algorithm or a best speed algorithm) based on the performance information provided via the performance monitor 122, such as that described above in connection with FIG. 3. To compress the uncompressed data chunk, the thread assignment module 128 may assign or allocate an available execution thread (operation 422) to compress the data chunk using the compression module 126 (operation 424), wherein the compressed data is stored in the buffer 404 previously allocated for the network queue 402, thus having the same identifier as the buffer 404 that holds the uncompressed data for the same data chunk. The compression module 126 may also associate an indication of the compression algorithm utilized with the compressed data chunk for use by the data target 160 in decompressing the data chunk. The performance monitor 122 may update the performance information to indicate that a thread has been allocated, thus reflecting processor utilization within the data source 110. Before, during, or after the compression of the current data chunk, the performance monitor 122 may also update the performance information using the identity of the particular compression algorithm utilized for this data chunk (operation 426), thus affecting the tracking of the compression ratio, as described above.

After completion of the compression of the current data chunk, the current thread may be de-allocated (operation 428) to allow compression of a subsequent data chunk using that thread, and the performance monitor 122 may update the performance information regarding processor utilization accordingly. Also, the buffer 404 previously containing the uncompressed data chunk may be removed from the input queue 403 and de-allocated to the buffer pool (operation 430), and the buffer 404 allocated to the network queue 402 that now contains the compressed data chunk may be added to the network queue 402 (operation 432). Moreover, the performance monitor 122 may update performance information describing the relative throughput of the network 150 compared to the throughput at the local data storage 130 based on the current number of buffers 404 in the network queue 402, thus representing the fullness or emptiness of the network queue 402. The network interface 132 may transmit the compressed data chunk from the buffer 404 via the network 150 to the data target 160 when the data chunk identifier associated with the buffer 404 matches the next identifier to be transmitted (operation 434) to maintain the proper transmission order of the data chunks. When the compressed data chunk has been transmitted, the data source 110 may remove the data buffer 404 holding the compressed data chunk from the network queue 402 and de-allocate the buffer 404 to the buffer pool (operation 436), and the performance monitor 122 may update the performance information regarding the relative throughput of the network 150 compared to the throughput at the local data storage 130 based on the current number of buffers 404 in the network queue 412.

The data source 110 may repeat operations 412-436 for each uncompressed data chunk of a data stream to be compressed and transmitted to the data target 160. Further, the filling of the input queue 403, the compression of the data chunks (including the emptying of the input queue 403 and the filling of the network queue 402) using the available execution threads, and the emptying of the network queue 402 may each be performed asynchronously of each other.

Figure 4E:
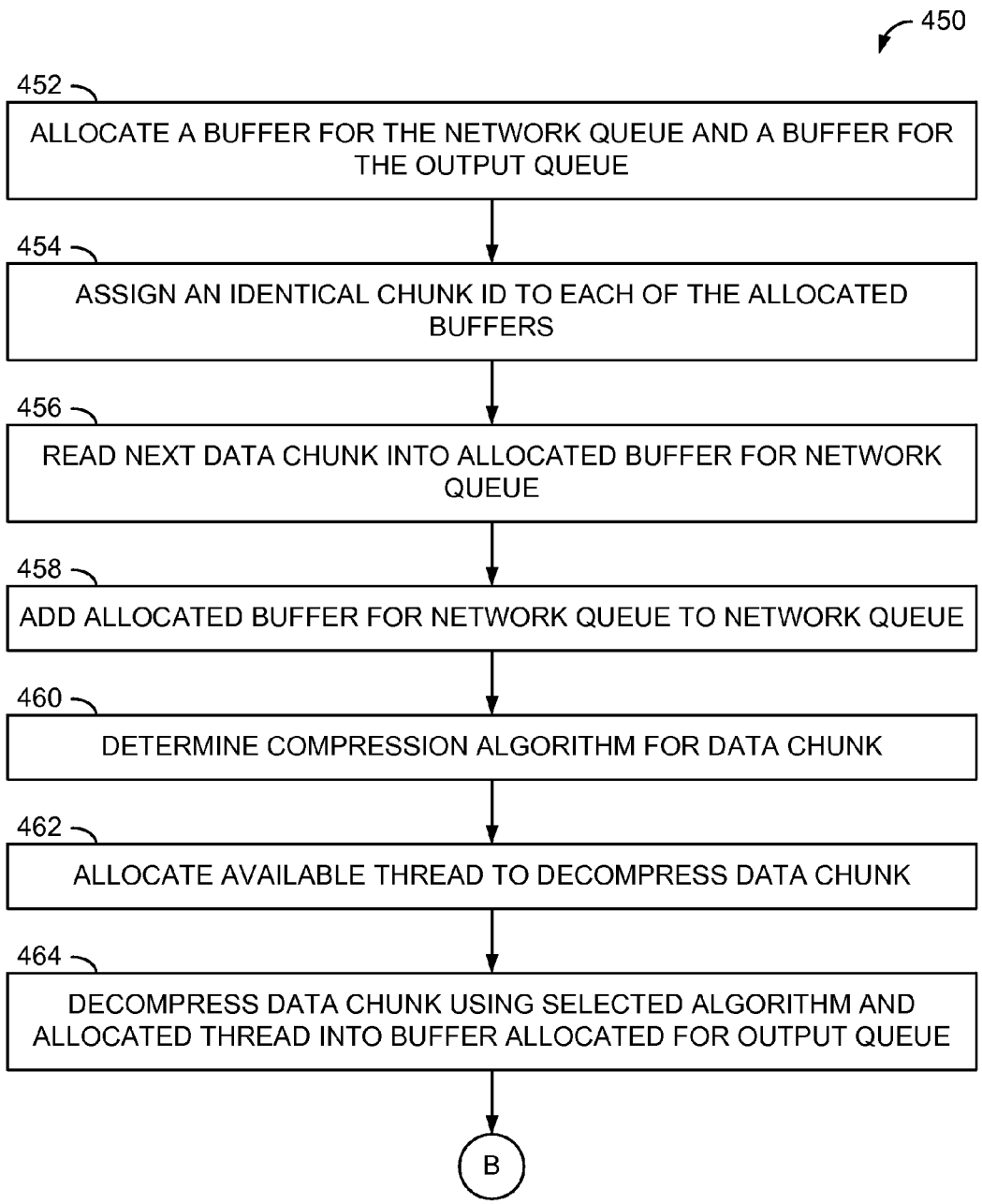
FIGS. 4E and 4F are a flow diagram of an example method of operating the data target of FIGS. 1 and 4B.
Figure 4F:
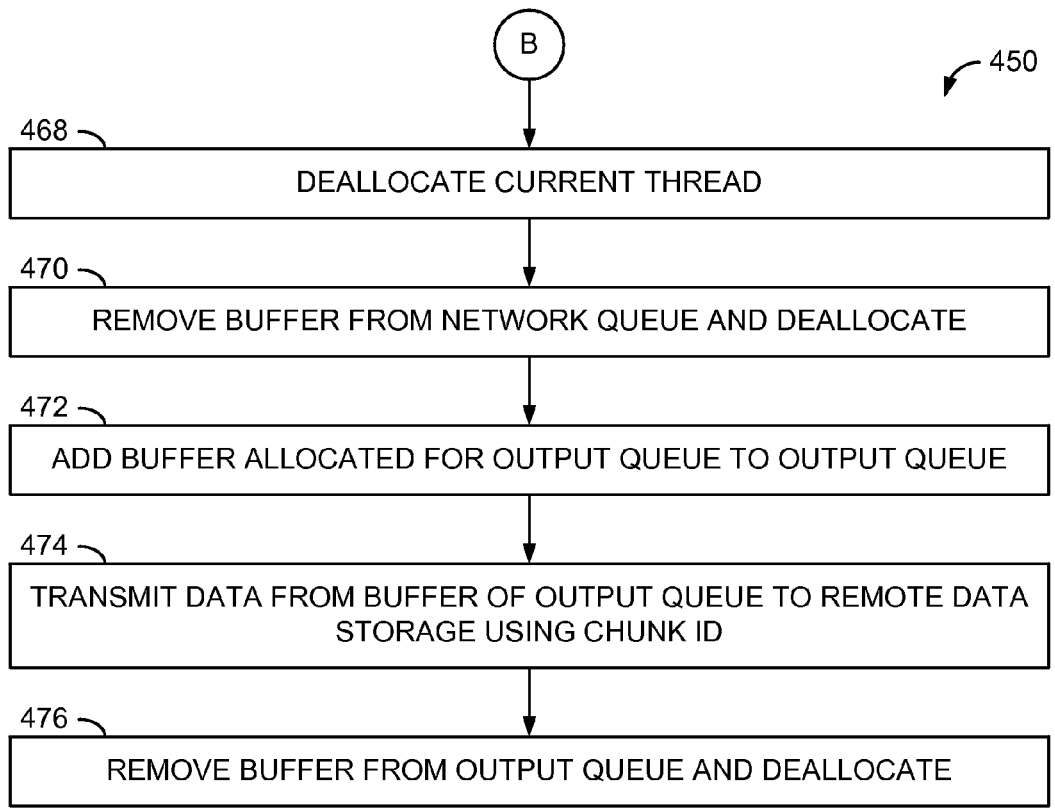

FIGS. 4E and 4F are a flow diagram of an example method 450 of operating the data target 160 of FIGS. 1 and 4B. In the method 450, a buffer 404 may be allocated for each of the network queue 412 and the output queue 413 (operation 452). These two buffers 404 may be allocated at the same time, and may be allocated from a buffer pool specifically associated with the current data stream, or from a single buffer pool serving all data streams to be received. In this example, if at least two buffers 404 are not available for allocation, the data target 160 will pause the reading of data chunks from the network 150 until such unallocated buffers 404 are available. Also, an identical identifier may be assigned to each of the two allocated buffers 404 (operation 454) so that each compressed data chunk of the network queue 412 may be associated with its corresponding uncompressed data chunk in the output queue 413, and that the proper order of the uncompressed data chunks will be maintained when written from the output queue 413 to the remote data storage 180. In at least some examples, the identifier associated with each buffer 404 is incremented for each pair of buffers 404 allocated.

The next compressed data chunk may then be read into the buffer 404 allocated for the network queue 412 from the network 150 (operation 456). That buffer 404 may then be added to the network queue 412 (operation 458) for processing by the decompression module 176. To that end, the decompression module 176 may determine the compression algorithm originally employed to compress the data chunk at the data source 110 using a compression indication accompanying the compressed data chunk (operation 460). To decompress the compressed data chunk, the thread assignment module 178 may assign or allocate an available execution thread (operation 462) to decompress the data chunk using the decompression module 126 (operation 464), wherein the compressed data is stored in the buffer 404 previously allocated for the output queue 413, thus having the same identifier as the buffer 404 that holds the compressed data for the same data chunk. The performance monitor 172 may update performance information to indicate that a thread has been allocated.

After completion of the decompression of the current data chunk, the current thread may be de-allocated (operation 468) to allow decompression of a subsequent data chunk using that thread, and the performance monitor 172 may update the performance information to indicate the de-allocation of the thread. Also, the buffer 404 previously containing the compressed data chunk may be removed from the network queue 412 and de-allocated to the buffer pool (operation 470), and the buffer 404 allocated to the output queue 413 that now contains the decompressed data chunk may be added to the output queue 413 (operation 472). The data target 160 may store the decompressed data chunk from the buffer 404 to the remote data storage 180 when the data chunk identifier associated with the buffer 404 matches the next identifier to be stored (operation 474) to maintain the proper order of data chunks in the remote data storage 180. When the decompressed data chunk has been stored, the data target 160 may remove the data buffer 404 holding the decompressed data chunk from the output queue 413 and de-allocated to the buffer pool (operation 476).

The data target 160 may repeat operations 452-476 for each compressed data chunk of a data stream to be decompressed and stored to the remote data storage 180. Moreover, the filling of the network queue 412, the decompression of the data chunks (including the emptying of the network queue 412 and the filling of the output queue 413) using the available execution threads, and the emptying of the output queue 413 may each be performed asynchronously of each other.

Figure 5:
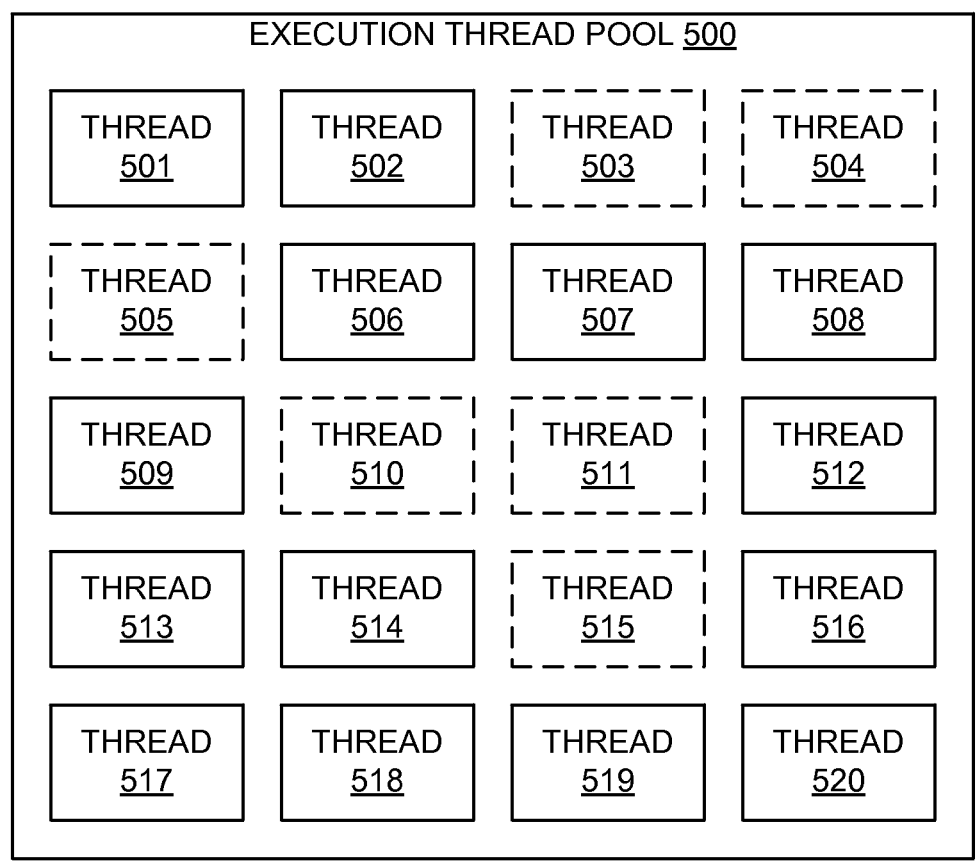
FIG. 5 is a block diagram of an example execution thread pool employed in a data source to determine a performance factor for an example method of dynamic data compression algorithm selection.

FIG. 5 is a block diagram of an example execution thread pool 500 employed in the data source 110 of FIG. 1 to determine a performance factor for an example method of dynamic data compression algorithm selection, such as the method 300 of FIG. 3. In this particular example, twenty execution threads 501-520 are provided in the thread pool 500, each of which may be employed to perform various tasks within the data source 110, including the various operations ascribed above to the performance monitor 122, the compression selection module 124, and the compression module 126. As depicted in FIG. 5, a current snapshot of the thread pool 500 may reveal that threads 503-505, 510, 511, and 515 (presented in dashed outline) are currently being employed for various tasks, and the threads 501, 502, 506-509, 512-514, and 516-520 are currently unused and available for other tasks. While the particular embodiment of FIG. 5 employs twenty threads total, other embodiments may employ greater or fewer numbers of threads, which may depend on, for example, the number of physical or virtual central processing units (CPUs) or cores available in the data source 110 or the data target 160.

In one example, the performance monitor 122 may determine the number or percentage of the currently unavailable or available threads of the thread pool 500 as a proxy or indication of the current processor utilization of the data source 110, as mentioned above. The compression selection module 124 may then compare the number or percentage of threads to some level or threshold to determine whether the associated processor utilization is high enough to warrant use of the best speed compression to refrain from further increasing the processor utilization such that overall throughput of the data source 110 would be negatively impacted. In other examples, if a pool of separate software processes is provided in the data source 110, the performance monitor 122 may determine the number of current software processes as a proxy for the current processor utilization.

Figure 6:
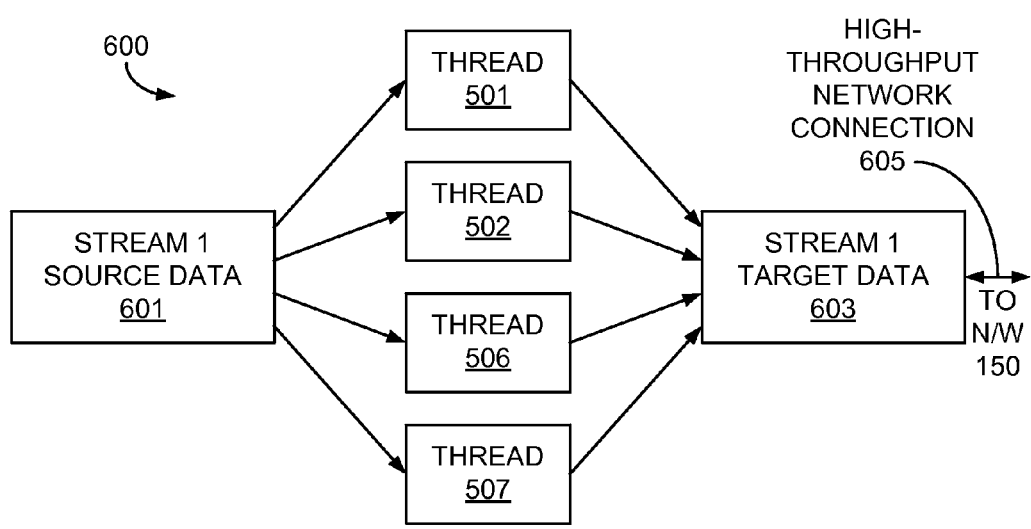
FIG. 6 is a block diagram of multiple threads assigned to compress data of a single data stream for transmission over a high-throughput network connection.

With respect to the thread assignment module 128, FIG. 6 is a block diagram of multiple available threads 501, 502, 506, and 507 assigned to compress source data 601 of a single data stream (e.g., STREAM 1) for transmission as compressed target data 603 for the single data stream over a high-throughput network connection 605 via the network 150. In this example, the network throughput of the connection 605 is high (e.g., as indicated by way of an empty or near-empty network queue, such as the network queue 402 of FIG. 4). Consequently, the thread assignment module 128 has allocated or assigned a relatively high number of threads (e.g., four threads 501, 502, 506, and 507) out of the total number of threads available in the thread pool 500 to perform compression and associated operations of the performance monitor 122, the compression selection module 124, and the compression module 126 discussed above to expedite the compression of the data chunks of the STREAM 1 source data 601 to utilize the high-throughput network connection 605 to greater effect, as the use of the additional threads may not cause the network queue 402 to be filled completely. Such use of additional threads, in conjunction with the compression selection module 124 possibly employing the best speed compression in response to the high-throughput network connection 605, as described above, may further expedite the compression of the STREAM 1 source data 601.

Figure 7:
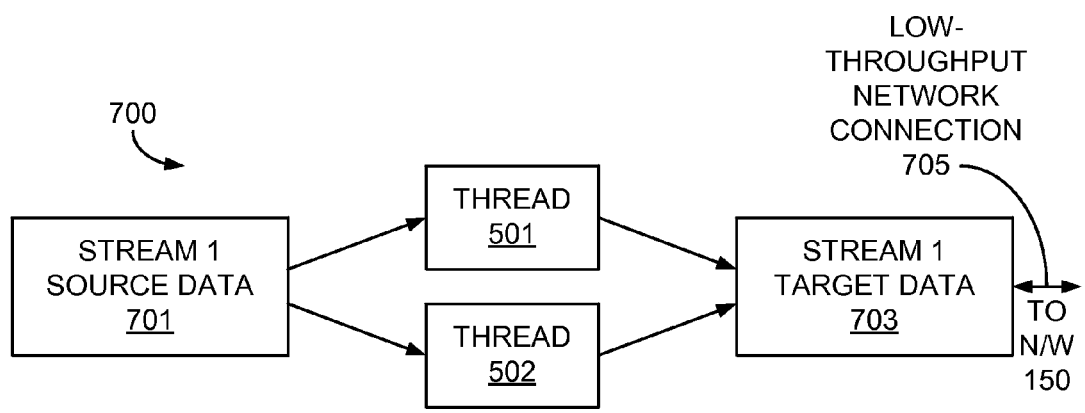
FIG. 7 is a block diagram of multiple threads assigned to compress data of a single data stream for transmission over a low-throughput network connection.

Conversely, FIG. 7 is a block diagram of multiple threads assigned to compress the source data 701 of a single data stream (e.g., STREAM 1) for transmission as compressed target data 703 for the single data stream over a low-throughput network connection 705 via the network 150. In this situation, in response to the low-throughput nature of the network connection 705 (e.g., a full or near-full network queue, such as the network queue 402 of FIG. 4), the thread assignment module 128 may assign a relatively low number of threads (e.g., two threads 501 and 502) to perform the monitoring, algorithm selection, and compression functions for the STREAM 1 source data 701, as the network queue 402 may be full in response to fewer threads being employed. In addition, the compression selection module 124, in reaction to the low-throughput nature of the network connection 705, may also employ the assigned threads 501 and 502 to perform the best compression algorithm to reduce the size of the STREAM 1 target data 703 to be transported to the data target 160 via the low-throughput network connection 705.

Figure 8:
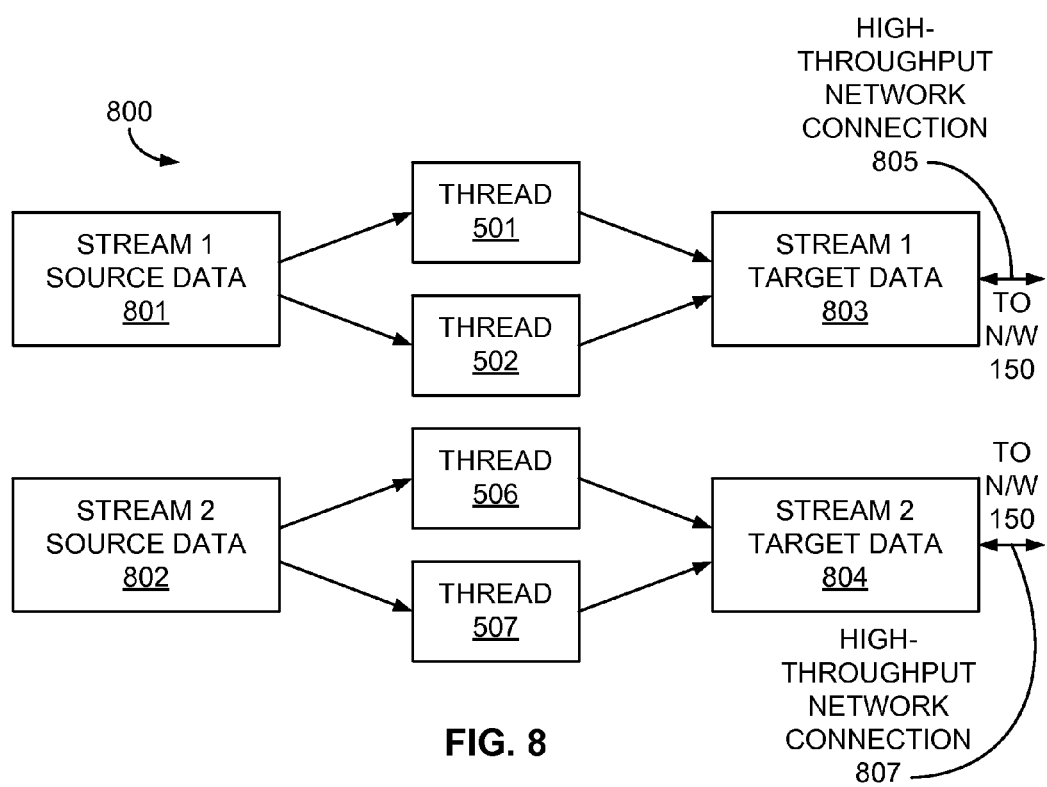
FIG. 8 is a block diagram of multiple threads assigned to compress data of two data streams for transmission over high-throughput network connections.

In further examples, the thread assignment module 128 may assign threads for the concurrent compression of multiple data streams based on the number of available threads in the thread pool 500, as well as in response to the level of throughput corresponding to the network connection associated with each data stream. For example, FIG. 8 is a block diagram of multiple threads assigned to compress the source data 801, 802 of two data streams (e.g., STREAM 1 and STREAM 2) for transmission over two high-throughput network connections 803, 804. In this example, the thread assignment module 128 may assign four threads (e.g., threads 501, 502, 506, and 507) to compress the two data streams if the network queues 402 are not being filled sufficiently or completely. Moreover, if the STREAM 1 target data 803 and the STREAM 2 target data 804 currently are being transmitted over high-throughput network connections 805 and 807, respectively, the thread assignment module 128 may evenly assign the threads 501, 502, 506, and 507 to the two data streams as a result of neither network queue 402 associated with each data stream becoming full. Oppositely, if the network connections associated with each of the STREAM 1 target data 803 and the STREAM 2 target data 804 currently exhibit low throughput, the thread assignment module 128 may assign an equal, but overall fewer, number of threads (e.g., two threads 501 and 502) to the two data streams due to the network queue 402 of each data stream remaining nearly or completely full, thus allowing the remaining threads to perform other functions within the data source 110. Additionally, the compression selection module 124 may determine that the high-throughput nature of the network connections 805, 807 warrants use of the best speed algorithm for both the STREAM 1 source data 801 and the STREAM 2 source data 802 to take greater advantage of the available bandwidth of the network connections 805, 807.

Figure 9:
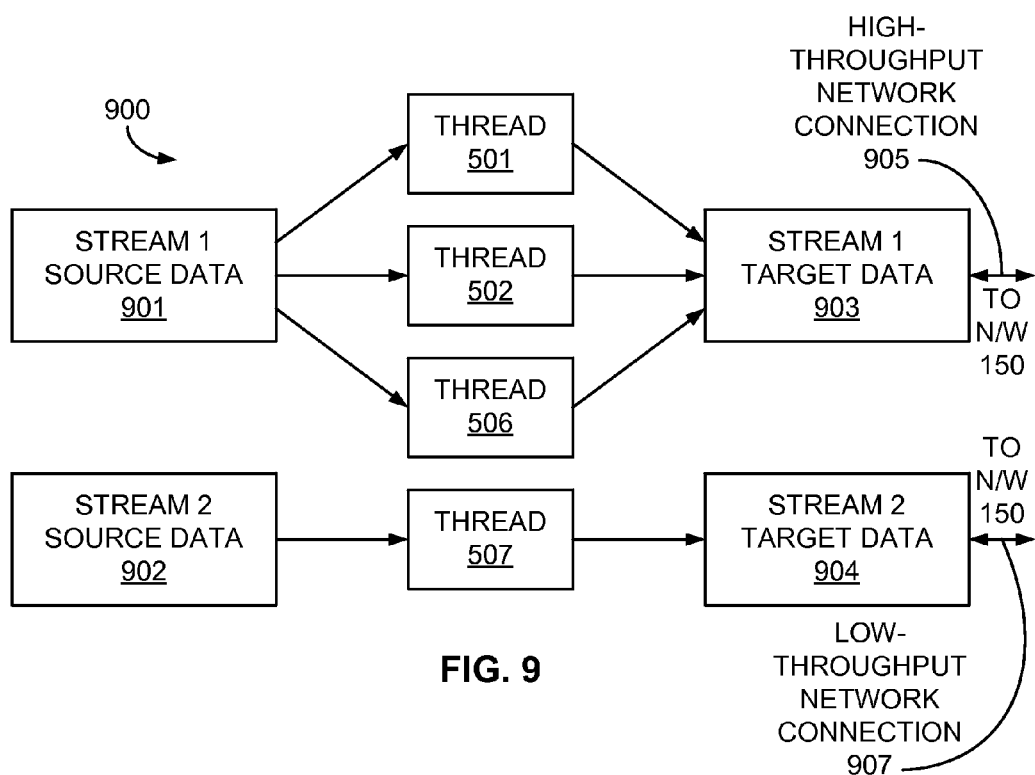
FIG. 9 is a block diagram of multiple threads assigned to compress data of two data streams for transmission over a high-throughput network connection and a low-throughput network connection.

FIG. 9 is a block diagram of multiple threads assigned to compress the source data 901, 902 of a first data stream (e.g., STREAM 1) and a second data stream (e.g., STREAM 2) for transmission over a high-throughput network connection 905 and a low-throughput network connection 907, respectively. In this example, the thread assignment module 128 determines that four threads (e.g., threads 501, 502, 506, and 507) are available to be assigned to compress the two data streams. In response to the STREAM 1 target data 903 and the STREAM 2 target data 904 currently being transmitted over a high-throughput network connection 905 and a low-throughput network connection 907, respectively, the thread assignment module 128 may assign a greater number of threads (e.g., three threads 501, 502, and 506) to the STREAM 1 target data 903 and a fewer number of threads (e.g., one thread 507) to the STREAM 2 target data 904 to take greater advantage of the additional throughput available via the network connection 905 while simultaneously reducing the bandwidth of the low-throughput network connection 907 consumed by the STREAM 2 target data 904 based on the fullness level of each of the network queues 402 associated with the two data streams. Moreover, the compression selection module 124 may determine that the best speed algorithm be employed to compress the STREAM 1 source data 901, and that the best compression algorithm be utilized to compress the STREAM 2 source data 902 in light of the measured throughputs of their corresponding network connections 905, 907, thus causing the amount of data included in the STREAM 1 target data 903 and the STREAM 2 target data 904 to comport with their corresponding connections 905, 907. As a result, the compression selection module 124 may employ different compression algorithms to different data streams that are being compressed in parallel.

In other examples, the thread assignment module 178 of the data target 160 may cause the decompression of the compressed data chunks using multiple execution threads based on the fullness or emptiness of the network queue 412 associated with each data stream in a corresponding manner to that described above in conjunction with FIGS. 6-9. More specifically, a fuller network queue 412 may result in more threads being assigned to decompress data chunks for the corresponding data stream, while an emptier network queue 412 may result in fewer threads being assigned to decompress the data chunks of that queue 412.

Figure 10:
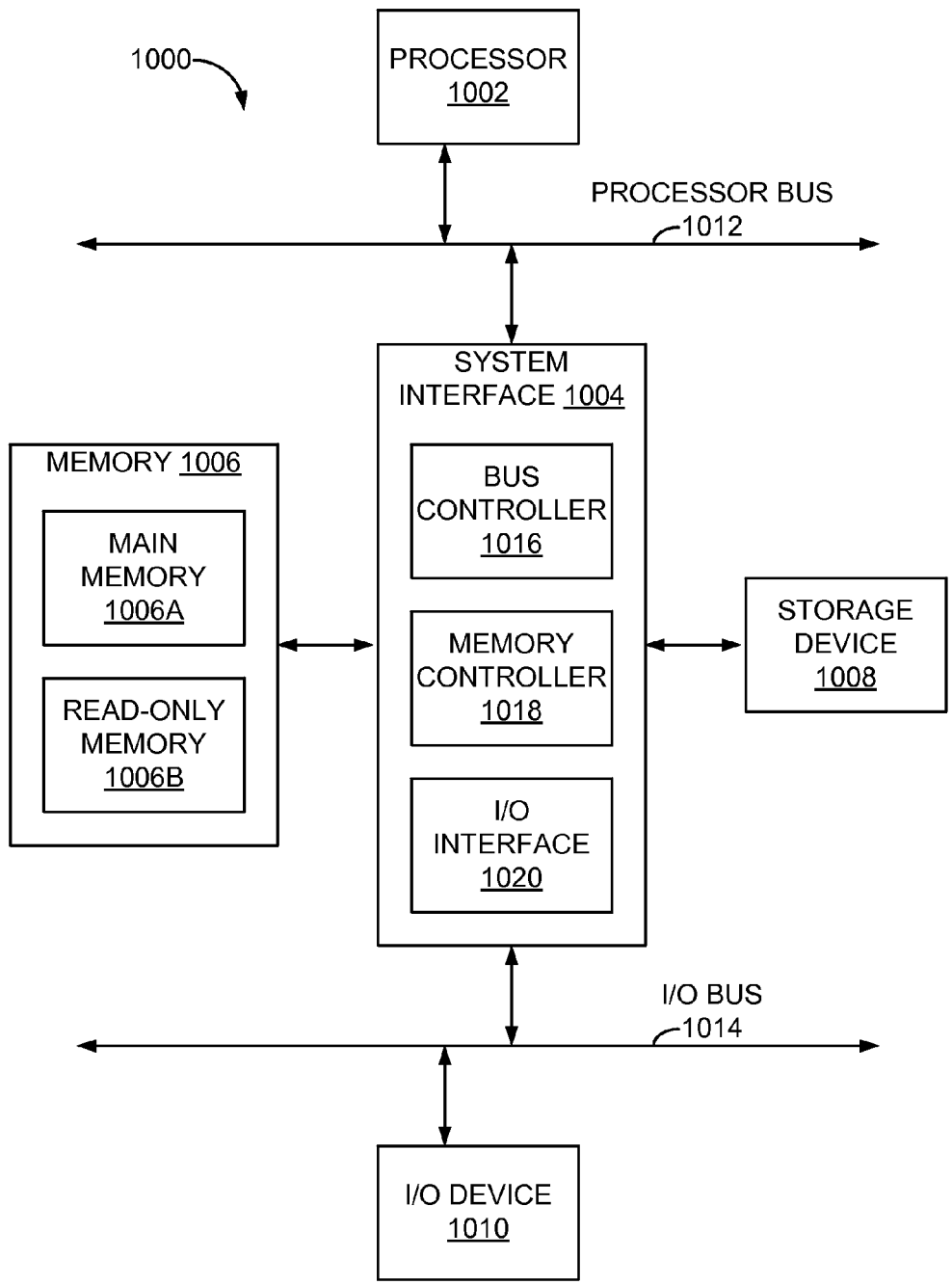
FIG. 10 is a block diagram illustrating an example of a computing system which may be used in implementing embodiments of the present disclosure.

FIG. 10 is a block diagram illustrating an example of a computing device or computer system 1000 which may be used to implement the embodiments disclosed above, such as the data source 110 and the data target 160 of FIG. 1. Embodiments disclosed herein include various operations that maybe performed by hardware modules or components, or hardware modules or components used in combination with software instructions. Moreover, as described herein, in some embodiments, a first module or component may be hardware that is programmed by one set of software or firmware instructions to perform one or more functions, while a second module or component may be that same hardware that is programmed by another set of software or firmware instructions to perform one or more other functions. As a result, the same hardware may represent the first module during one period of time, and may represent the second module during the same time or a second period of time. According to one example, the computing device or system 1000 may include at least one processor 1002, at least one system interface 1004, at least one memory 1006, at least one storage device 1008, and at least one I/O device 1010. The system 1000 may further include at least one processor bus 1012 and/or at least one input/output (I/O) bus 1014.

The processor 1002 may include one or more internal levels of cache (not shown in FIG. 10) and can be any known processor, such as a microprocessor, microcontroller, digital signal processor, graphics processor, or the like. The processor bus 1012, also possibly known as a host bus or a front side bus, may be used to couple the processor 1002 with the system interface 1004. The system interface 1004 may be connected to the processor bus 1012 to interface various components of the system with the processor 1002. System interface 1004 may, for example, include a bus controller 1016 or bus interface unit to direct interaction with the processor bus 1012 and a memory controller 1018 for interfacing the memory 1006 with the processor bus 1012. The system interface 1004 may also include an I/O interface 1020 to interface one or more I/O devices 1010 with the processor 1002.

The memory 1006 may include one or more memory cards and control circuits (not depicted in FIG. 10). The memory 1006 may include a main memory 1006A and/or a read-only memory (ROM) 1006B. The main memory 1006A can be random access memory (RAM) or any other dynamic storage device(s) for storing information and instructions to be executed by the processor 1002. Main memory 1006A may be used for storing temporary variables or other intermediate information during execution of instructions by the processor 1002. The read-only memory 1006B can be any static storage device(s), such as Programmable Read Only Memory (PROM) chip for storing static information and instructions for the processor.

According to one embodiment, the above methods may be performed by the computer system 1000 in response to the processor 1002 executing one or more sequences of one or more instructions contained in the main memory 1006A. These instructions may be read into main memory 1006A from another machine-readable medium capable of storing or transmitting information in a form (e.g., software, processing application) readable by a machine (e.g., a computer). Execution of the sequences of instructions contained in the main memory 1006A may cause the processor 1002 to perform the process operations described herein.

A machine-readable media may take the form of, but is not limited to, non-volatile media and volatile media. Non-volatile media may include a mass storage device 1008 and volatile media may include dynamic storage devices. Common forms of machine-readable media may include, but are not limited to, magnetic storage media (e.g. hard disk drive); optical storage media (e.g. Compact Disc Read-Only Memory (CD-ROM) and Digital Versatile Disc Read-Only Memory (DVD-ROM)), magneto-optical storage media; read-only memory (ROM); random access memory (RAM, such as static RAM (SRAM) and dynamic RAM (DRAM)); erasable programmable memory (e.g., erasable programmable read-only memory (EPROM) and electrically erasable programmable read-only memory (EEPROM)); flash memory; or other types of media suitable for storing computer or processor instructions.

Embodiments disclosed herein include various operations that are described in this specification. As discussed above, the operations may be performed by hardware components and/or may be embodied in machine-executable instructions, which may be used to cause a general-purpose or special-purpose processor programmed with the instructions to perform the operations. Alternatively, the operations may be performed by a combination of hardware, software, and/or firmware.

The performance of one or more operations described herein may be distributed among one or more processors, not only residing within a single machine, but deployed across a number of machines. In some examples, the one or more processors or processor-implemented modules may be located in a single geographic location (e.g., within a home environment, an office environment, or a server farm). In other embodiments, the one or more processors or processor-implemented modules may be distributed across a number of geographic locations.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores may be arbitrary, and particular operations are illustrated in a context of specific illustrative configurations. In general, structures and functionality presented as separate resources in the examples configurations may be implemented as a combined structure or resource. Similarly, structures and functionality presented as a single resource may be implemented as separate resources.

While the present disclosure has been described with reference to various embodiments, these embodiments are illustrative, and the scope of the disclosure is not limited to such embodiments. Various modifications and additions can be made to the exemplary embodiments discussed herein without departing from the scope of the disclosure. For example, while the embodiments described above refer to particular features, the scope of this disclosure also includes embodiments having different combinations of features, as well as embodiments that do not include all of the described features. Accordingly, the scope of the disclosure is intended to embrace all such alternatives, modifications, and variations, together with all equivalents thereof.

The invention claimed is:

1. A system for data compression employing dynamic compression selection, the system comprising:
   a performance monitor to determine, as uncompressed data chunks of a data stream are compressed, at least one performance factor affecting selection of one of multiple compression algorithms for the uncompressed data chunks of the data stream, each of the multiple compression algorithms facilitating a different expected compression ratio;
   a compression selection module, by a hardware processor of a machine, to select separately, for each uncompressed data chunk, one of the multiple compression algorithms based on the at least one performance factor; and
   a compression module to compress each uncompressed data chunk using the selected one of the multiple compression algorithms for the uncompressed data chunk.

2. The system of claim 1, the at least one performance factor comprising a resulting compression ratio of at least one compressed data chunk of the data stream.

3. The system of claim 2, wherein:
   the multiple compression algorithms comprise a first compression algorithm and a second compression algorithm, the second compression algorithm facilitating a lower expected compression ratio than the first compression algorithm; and
   the compression selection module is further to select the second compression algorithm in response to the resulting compression ratio being lower than a particular threshold.

4. The system of claim 1, the at least one performance factor comprising a current network throughput for at least one compressed data chunk of the data stream transmitted over a network for storing at a target location.

5. The system of claim 4, the performance monitor to evaluate the current network throughput relative to a storage throughput for uncompressed data chunks of the data stream retrieved from storage prior to compression.

6. The system of claim 4, the performance monitor to evaluate the current network throughput by determining a current depth of a queue of compressed data chunks awaiting transmission over the network for storing at the target location.

7. The system of claim 4, wherein:
   the multiple compression algorithms comprise a first compression algorithm and a second compression algorithm, the second compression algorithm facilitating a lower expected compression ratio than the first compression algorithm; and
   the compression selection module is further to select the second compression algorithm in response to the current network throughput being higher than a storage throughput for uncompressed data chunks of the data stream retrieved from storage prior to compression.

8. The system of claim 1, the at least one performance factor comprising a current processor utilization of the system.

9. The system of claim 8, the performance monitor to evaluate the current processor utilization by determining a number of currently active execution threads in the system.

10. The system of claim 8, the performance monitor to evaluate the current processor utilization by determining a number of current software processes executing in the system.

11. The system of claim 8, wherein:
   the multiple compression algorithms comprise a first compression algorithm and a second compression algorithm, the second compression algorithm facilitating a lower expected compression ratio than the first compression algorithm; and
   the compression selection module is further to select the second compression algorithm in response to the current processor utilization being higher than a particular threshold.

12. The system of claim 1, each of the uncompressed data chunks being less than or equal to a predetermined size.

13. The system of claim 1, wherein:
   the data stream comprises a first data stream;
   the selected one of the multiple compression algorithms comprises a selected first one of the multiple compression algorithms;
   the performance monitor is to determine, as uncompressed data chunks of a second data stream are compressed, at least one performance factor affecting selection of one of the multiple compression algorithms for the uncompressed data chunks of the second data stream;
   the compression selection module is to select separately, for each uncompressed data chunk of the second data stream, a second one of the multiple compression algorithms for the uncompressed data chunk of the second data stream based on the at least one performance factor associated with the second data stream, wherein the selected second one of the multiple compression algorithms is independent of the selected first one of the multiple compression algorithms; and
   the compression module is to compress each uncompressed data chunk of the second data stream using the selected second one of the multiple compression algorithms for the uncompressed data chunk of the second data stream.

14. The system of claim 1, wherein
the at least one performance factor comprises:
   a resulting compression ratio of at least one compressed data chunk of the data stream; and
   a current network throughput for at least one compressed data chunk of the data stream transmitted over a network for storing at a target location;
   the multiple compression algorithms comprise a first compression algorithm and a second compression algorithm, the second compression algorithm facilitating a lower expected compression ratio than the first compression algorithm; and
   the compression selection module is further to select the second compression algorithm in response to at least one of the resulting compression ratio being lower than a threshold or the current network throughput being higher than a storage throughput for uncompressed data chunks of the data stream retrieved from storage prior to compression.

15. The system of claim 1, wherein
the at least one performance factor comprises:
   a resulting compression ratio of at least one compressed data chunk of the data stream; and
   a current processor utilization of the system;
   the multiple compression algorithms comprise a first compression algorithm and a second compression algorithm, the second compression algorithm facilitating a lower expected compression ratio than the first compression algorithm; and the compression selection module is further to select the second compression algorithm in response to at least one of the resulting compression ratio being lower than a first threshold or the current processor utilization being higher than a second threshold.

16. The system of claim 1, wherein
the at least one performance factor comprises:
a current network throughput for at least one compressed data chunk of the data stream transmitted over a network for storing at a target location; and
a current processor utilization of the system;
the multiple compression algorithms comprise a first compression algorithm and a second compression algorithm, the second compression algorithm facilitating a lower expected compression ratio than the first compression algorithm; and
the compression selection module is further to select the second compression algorithm in response to at least one of the resulting network throughput being higher than a storage throughput for uncompressed data chunks of the data stream retrieved from storage prior to compression or the current processor utilization being higher than a threshold.

17. The system of claim 1, wherein
the at least one performance factor comprises:
a resulting compression ratio of at least one compressed data chunk of the data stream;
a current network throughput for at least one compressed data chunk of the data stream transmitted over a network for storing at a target location; and
a current processor utilization of the system;
the multiple compression algorithms comprise a first compression algorithm and a second compression algorithm, the second compression algorithm facilitating a lower expected compression ratio than the first compression algorithm; and
the compression selection module is further to select the second compression algorithm in response to at least one of the resulting compression ratio being lower than a first threshold, the resulting network throughput being higher than a storage throughput for uncompressed data chunks of the data stream retrieved from storage prior to compression, or the current processor utilization being higher than a second threshold, and otherwise to select the first compression algorithm.

18. The system of claim 1, wherein:
the multiple compression algorithms comprise a first compression algorithm and a second compression algorithm, the second compression algorithm facilitating a lower expected compression ratio than the first compression algorithm; and
the compression module is to employ a greater number of execution threads to compress at least some of the uncompressed data chunks of the data stream using the second compression algorithm compared to compressing at least some others of the uncompressed data chunks of the data stream using the first compression algorithm.

19. A method comprising:
determining, as uncompressed data chunks of a data stream are compressed, at least one performance factor affecting selection of one of multiple compression algorithms for the uncompressed data chunks of the data stream, each of the multiple compression algorithms facilitating a different expected compression ratio;
selecting, by a hardware processor of a machine, separately, for each uncompressed data chunk, one of the multiple compression algorithms based on the at least one performance factor; and
compressing each uncompressed data chunk using the selected one of the multiple compression algorithms for the uncompressed data chunk.

20. A non-transitory computer-readable data storage medium comprising instructions that, when executed by at least one processor of a machine, cause the machine to perform operations comprising:
determining, as uncompressed data chunks of a data stream are compressed, at least one performance factor affecting selection of one of multiple compression algorithms for the uncompressed data chunks of the data stream, each of the multiple compression algorithms facilitating a different expected compression ratio;
selecting separately, for each uncompressed data chunk, one of the multiple compression algorithms based on the at least one performance factor; and
compressing each uncompressed data chunk using the selected one of the multiple compression algorithms for the uncompressed data chunk.

* * * * *